United States Patent [19]

Nelson et al.

[11] Patent Number: 4,661,961
[45] Date of Patent: Apr. 28, 1987

[54] BURIED HETEROSTRUCTURE DEVICES WITH UNIQUE CONTACT-FACILITATING LAYERS

[75] Inventors: Ronald J. Nelson, Berkeley Heights; Randall B. Wilson, Maplewood, both of N.J.

[73] Assignee: American Telephone and Telegraph Company, AT&T Bell Laboratories, Murray Hill, N.J.

[21] Appl. No.: 790,072

[22] Filed: Oct. 22, 1985

Related U.S. Application Data

[62] Division of Ser. No. 505,993, Jun. 20, 1983, Pat. No. 4,566,171.

[51] Int. Cl.[4] .................. H01L 23/48; H01S 3/19
[52] U.S. Cl. ........................ 372/46; 357/16; 357/17; 357/65
[58] Field of Search ............... 372/46, 45, 44; 357/16, 357/17, 65, 67

[56] References Cited

U.S. PATENT DOCUMENTS

| | | | |
|---|---|---|---|
| 3,833,435 | 9/1974 | Logal et al. | 148/DIG. 72 |
| 4,137,107 | 1/1979 | Nijman et al. | 148/175 X |
| 4,366,569 | 12/1982 | Hirao et al. | 29/569 L |
| 4,426,700 | 1/1984 | Hirao et al. | 372/46 X |
| 4,426,702 | 1/1984 | Yamashita et al. | 148/171 X |
| 4,481,631 | 11/1984 | Henry et al. | 372/46 X |
| 4,496,403 | 1/1985 | Turley | 29/569 L |

OTHER PUBLICATIONS

R. J. Nelson et al., "CW Electrooptical Properties of InGaAsP ($\lambda = 1.3$ $\mu$m) Buried-Heterostructure Lasers", *IEEE Journal of Quantum Electronics*, vol. QE-17, No. 2, Feb. 1981, pp. 202-206.
R. J. Nelson et al., "Self-sustained Pulsations and Negative-resistance Behavior in InGaAsP ($\lambda = 1.3$ $\mu$m) Double-heterostructure Lasers", *Applied Physics Letters*, vol. 37, No. 9, Nov. 1, 1980, pp. 769-771.
M. Hirao et al., "Fabrication and Characterization of Narrow Stripe InGaAsP/InP Buried Heterostructure Lasers", *Journal of Applied Physics*, vol. 51, No. 8, Aug. 1980, pp. 4539-4540.
R. J. Nelson et al., "Electrical-Optical Characteristics of Buried Waveguide Heterostructure InGaAsP Injection Lasers", *International Electron Devices Meeting Technical Digest*, Washington, D.C., Dec. 8-10, 1980, pp. 370-373.
G. Olsen et al., "1.3 $\mu$m LPE- and VPE-Grown InGaAsP Edge-Emitting LED's", *IEEE Journal of Quantum Electronics*, vol. QE-17, No. 10, Oct. 1981, pp. 2130-2134.

*Primary Examiner*—James W. Davie
*Attorney, Agent, or Firm*—Michael J. Urbano

[57] ABSTRACT

In the fabrication of buried heterostructure InP/InGaAsP lasers, mask undercutting during the mesa etching step is alleviated by a combination of steps which includes the epitaxial growth of a large bandgap InGaAsP cap layer (1.05 eV$\lesssim E_g \lesssim$1.24 eV) and the plasma deposition of a SiO$_2$ etch masking layer. Alternatively, the cap layer may be a bilayer: an InGaAs layer or narrow bandgap InGaAsP ($E_g \lesssim$1.05 eV), which has low contact resistance, and a thin InP protective layer which reduces undercutting and which is removed after LPE regrowth is complete. In both cases, etching at a low temperature with agitation has been found advantageous.

7 Claims, 5 Drawing Figures

BURIED HETEROSTRUCTURE DEVICES WITH UNIQUE CONTACT-FACILITATING LAYERS

This application is a divisional of copending application Ser. No. 505,993, filed on June 20, 1983 U.S. Pat. No. 4,566,171.

BACKGROUND OF THE INVENTION

This invention relates to semiconductor devices and, more particularly, to buried heterostructure lasers.

Semiconductor diode lasers fabricated from the InGaAsP/InP materials system are currently of interest for application in optical communication systems operating at 1.0–1.6 μm. Of the wide variety of possible laser structures which can be fabricated, those which utilize a real refractive index waveguide, such as a buried heterostructure (BH), have recently been shown to have advantages with respect to the absence of both self-pulsations in their outputs and kinks in their light-current behavior. [R. J. Nelson et al, *Applied Physics Letters*, 37, 769 (1980).] For most refractive-index-guided laser structures, the fabrication sequence usually requires an etching step to form a mesa which ultimately defines the lateral dimensions of the optical cavity and the active region of the laser. Since the transverse mode characteristics of this cavity depend on, among other factors, the cavity geometry and dimensions, it is important to exercise a high degree of control over these parameters during the etching process if high yields of single transverse mode devices are to be obtained. For example, typically the dimensions of the active region of a BH laser, which operates in the fundamental transverse mode, are 0.15 μm in thickness and a maximum of 2.0 μm in width. Associated with the problem of strict geometrical and dimensional control is the problem of mask undercutting. This undercutting is often unpredictable, leading to a loss of dimensional and geometrical control over the desired mesas. In the case of a BH laser, having a 2.0 μm wide active layer, undercutting of only 1.0 μm on each side of the mesa results in complete loss of the mesas on the wafer. Even in cases where the mask undercutting is predictable and can be allowed for, a large amount of mask overhang can lead to problems in later processing steps, such as LPE regrowth where local growth dynamics can be adversely affected. It is clear, therefore, that the etchant system and etching technique used to fabricate mesas for these laser structures must allow for precise geometrical and dimensional control with little or no undercutting. In addition, the etchant of choice should leave a contaminant-free surface which is smooth and free from pits or other defects which may lead to problems in subsequent processing steps.

Bromine-methanol is one etchant which has been utilized successfully as a preferential etchant in the fabrication of InGaAsP/InP BH lasers [M. Hirao et al, *Journal of Applied Physics*, 51, 4539 (1980); R. J. Nelson et al, *IEEE Journal of Quantum Electronics*, 17, 202 (1981)] and buriedo-waveguide-heterostructure lasers [R. B. Wilson et al, International Electron Devices Meeting, *Technical Digest*, 370 (1980)]. In those reports, however, emphasis was placed on device results rather than on the mesa etching process and the mask undercutting problem.

SUMMARY OF THE INVENTION

We have found that wet chemical etching can be used successfully to fabricate InP/InGaAsP BH lasers without significant undercutting occurring during the mesa etching step. In accordance with one aspect of our invention, a large bandgap InGaAsP cap layer is epitaxially grown on top of the BH and a $SiO_2$ masking layer is plasma deposited on the cap layer. The masking layer is patterned using conventional photolithographic techniques, and then mesas are etched preferably using low temperature Br-methanol with agitation. For limited undercutting and low contact resistance the bandgap $E_g$ of the cap layer should be $1.05$ eV$\lesssim E_g \lesssim 1.24$ eV. LPE regrowth of InP lateral confinement layers along the sides of the mesa completes the BH.

Another aspect of our invention contemplates the use of a multilayer cap layer including an InGaAs layer, or a narrow bandgap InGaAsP layer, which provides for low contact resistance, and a thin InP protective layer, which reduces undercutting and which is removed after LPE regrowth is complete. In this case LPE regrowth includes first growing the usual InP confinement layers along the sides of the mesa and then growing a quaternary protective layer over the InP confinement layers so that the InP protective layer can be selectively etched away without attacking the confinement layers.

BRIEF DESCRIPTION OF THE DRAWING

Our invention, together with its various features and advantages, can be readily understood from the following, more detailed description taken in conjunction with the accompanying drawings, in which the figures have not been drawn to scale in the interest of simplicity and clarity of illustration.

Common elements in different figures have been given identical reference numbers in order to facilitate comparison.

DETAILED DESCRIPTION

Figure 1:
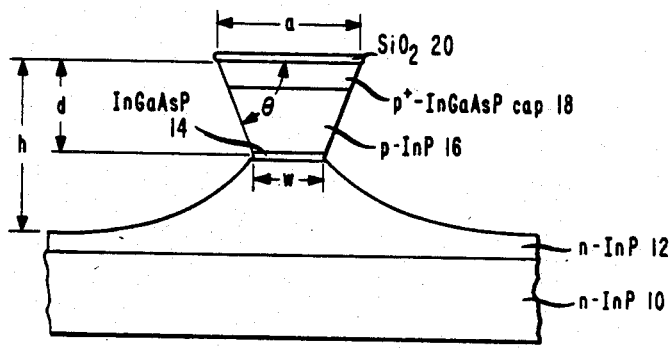
FIG. 1 shows a heterostructure after mesa etching in accordance with one aspect of our invention.
Figure 2:
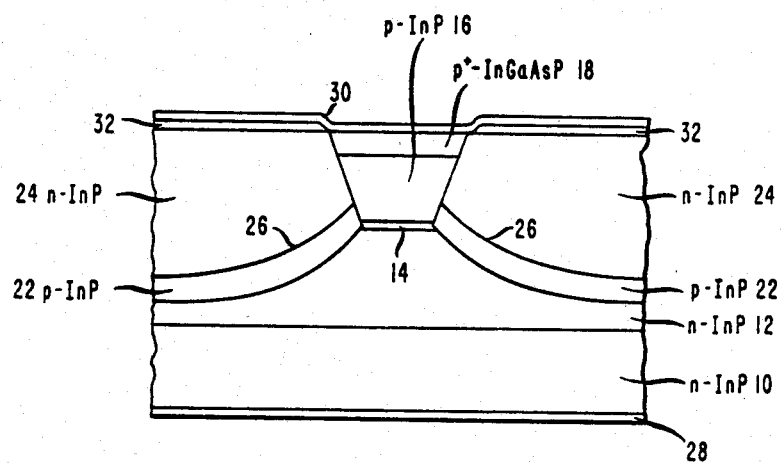
FIG. 2 shows a BH laser incorporating the structure of FIG. 1.

With reference now to FIG. 2, the buried heterostructure (BH) laser shown is fabricated by first epitaxially growing a double heterostructure (DH) wafer on a suitable single crystal substrate. In general, the epitaxial layers are then masked and etched to form elongated mesas, one of which is shown in end view in FIG. 1. The geometry of the mesa delineates the stripe shape of the active layer which is typically located near the neck of the mesa. Later, epitaxial regrowth of layers along the sides of the mesa surrounds the active layers with wider bandgap, lower refractive index material and completes each BH. Electrical contacts are applied to the top and bottom of the wafer, which is then diced, as by cleaving and sawing, into individual laser chips. Finally, each laser is mounted on a suitable heat sink (not shown).

More specifically, consider the InP/InGaAsP BH laser of FIG. 2. This laser comprises an n-InP substrate 10 on which are epitaxially grown (illustratively by liquid phase epitaxy (LPE)) the following, essentially lattice-matched layers in the order recited: an n-InP first cladding layer 12, an unintentionally doped $In_{1-y}Ga_yAs_xP_{1-x}$ active layer 14, a p-InP second cladding layer 16, and a p+-InGaAsP contact-facilitating cap layer 18. These layers form a double heterostructure (DH) wafer. The proportions x and y in the active layer are chosen according to the desired operating wavelength of the laser as described, for example, by Olsen et al, *IEEE Journal of Quantum Electronics*, QE-17, 131 (1981).

In order to delineate elongated mesas of the type shown in FIG. 2 from this wafer, a $SiO_2$ etch-masking layer is deposited on cap layer 18 and, using standard photolithographic techniques, is patterned to form a stripe mask 20 over each intended mesa. Etching with Br-methanol delineates the mesa and narrows the active layer 14 to less than about 2.0 μm wide. (It is typically about 0.1–0.2 μm thick.)

In accordance with our invention, the mesa is delineated without significantly undercutting the mask 20 by a combination of steps; namely, the cap layer 18 is made to have a bandgap $E_g$ in the range $1.05\ eV \lesssim E_g \lesssim 1.24$ eV, and the $SiO_2$ mask 20 is plasma deposited under particular conditions (described more fully later). Then, the mesa is etched using Br-methanol at a low temperature (preferably about 0° C.) with agitation so as to increase the ratio of etch depth to undercut. Above the upper limit of $E_g$, the contact resistance is undesirably high, whereas below the lower limit excessive undercutting occurs.

Under these conditions, undercutting is no greater than about 0.5 μm on a side, and the specific contact resistance is less than $10^{-5}$ ohm-$cm^2$.

After etching the mesa structure shown in FIG. 1, InP layers 22 and 24 are regrown by LPE along both sides of the mesa so as to surround the active layer 14 with wider bandgap, lower refractive index material. In addition, the first layers regrown are p-InP layers 22 and the second layers are n-InP layers 24, thereby forming blocking p-n junctions 26 therebetween. That is, when the cladding layers 12 and 16 are forward-biased to cause laser emission from active layer 14, the blocking junctions 26 are reverse-biased so that current is constrained to flow primarily through the mesa and hence through the active layer.

Forward-bias voltage and pumping current are applied to the device via a broad area metal contact 28 formed on the substrate 10 and a stripe geometry metal contact 30 formed on n-InP layers 24. The stripe is delineated by an opening in dielectric layer 32. The source of voltage and current is not shown.

Figure 5:
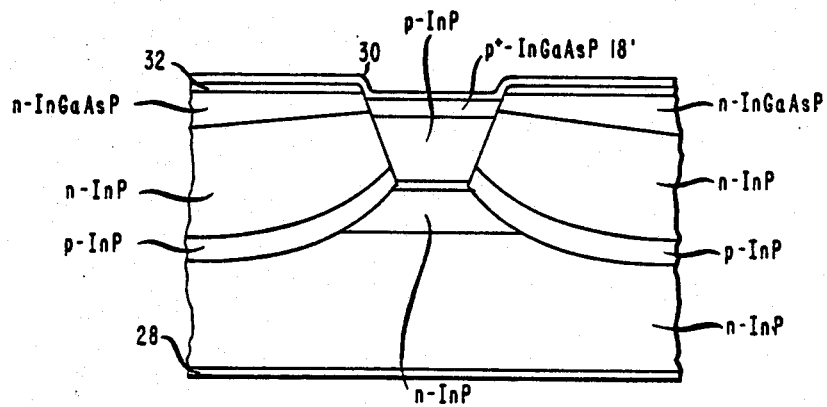
FIG. 5 shows a BH laser incorporating the structure of FIG. 4.

In an alternative embodiment of our invention, a BH laser of the type depicted in FIG. 5 is fabricated as follows. An InP/InGaAsP/InP DH (layers 12, 14, and 16) is fabricated in essentially the same manner as described above. However, the cap layer 18' comprises narrow bandgap ($E_g \lesssim 1.05$ eV) p+-In GaAsP or p+-InGaAs rather than the higher bandgap ($E_g \gtrsim 1.05$ eV) InGaAsP described above. In order to exploit the superior electrical contacting properties of the narrow bandgap material, a protective layer 19 of p-InP is grown over the cap layer 18'. Layer 19 reduces undercutting and protects layer 18' during subsequent mesa etching steps. In order to define the mesa, $SiO_2$ stripes 20 are plasma deposited onto the protective layer 19 as described above. Etching in Br-methanol results in the mesa configuration shown in FIG. 3.

Figure 3:
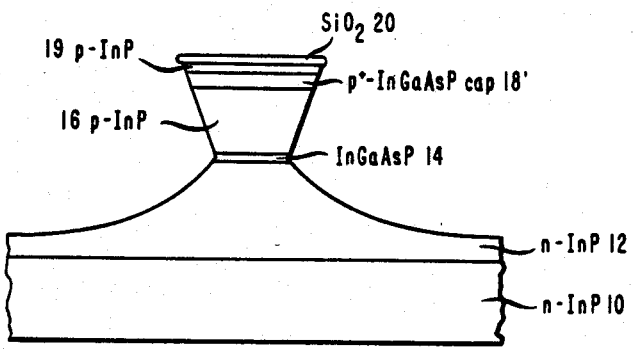
FIG. 3 shows another heterostructure after mesa etching in accordance with a second aspect of our invention.
Figure 4:
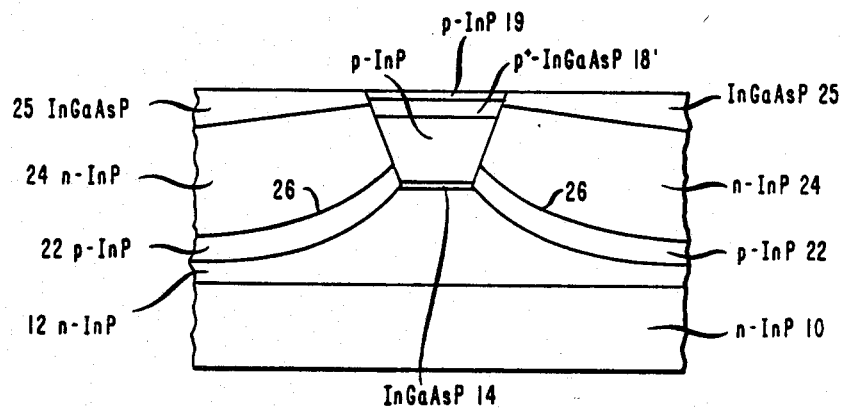
FIG. 4 shows the structure of FIG. 3 after regrowth of epitaxial layers to form a BH.

Next, LPE regrowth of InP layers along the sides of the mesa results in the formation of blocking junctions 26 as previously described and as shown in FIG. 4. In addition, however, protective layers 25 of InGaAsp are grown over the InP layers 24. The layers 25 enable the p-InP protective layer 19 to be removed by a selective etchant such as 7M–12M HCl without also attacking the underlying InP blocking layers 22 and 24. The p-InP protective layer 19 is removed because it is difficult to make good electrical contact to this material, whereas a far superior electrical contact can be made to the underlying narrow bandgap layer 18'. The completed BH laser is shown in FIG. 5 where the broad area contact 28 and the stripe contact 30 have been applied in the manner described in reference to FIG. 3.

EXAMPLE I

The following example describes experiments that were performed to demonstrate the superior undercutting characteristics of the combination of a plasma deposited $SiO_2$ mask and an LPE-grown InGaAsP cap layer having a bandgap $E_g$ in the range of approximately 1.05–1.24 eV.

The substrate was Sn-doped ($n \approx 10^{18}\ cm^{-3}$) InP and had a surface orientation within about 1° of the (001) {001}/{111} interfacial angle of 61°±2° was somewhat larger than the expected value of 54.74°. The difference may be due to effects of nearby vicinal planes, similar to results found for Br-methanol etching of GaAs.

The mesa profile achieved using the etching techniques described here has been used to fabricate BH lasers of the type shown in FIG. 2. A mesa of the particular geometry shown in FIG. 1 allows for a narrow active layer stripe width (w) near the "neck" of the mesa, while maintaining a wider electrical contact region (a) near the top of the mesa. The geometric relation between the neck width (w), the neck depth (d), and the stripe width (a) is given by the expression:

$$w = a - 2d/\tan\theta \quad (1)$$

where $\theta$ is the interfacial angle. Because the only depth parameter which is easily measured is the total etch depth (h), the relationship between the neck depth (d) and the total etch depth (h) must be determined in order to utilize Eq. (1) in a practical fashion. The experimental determination of this relation is described by the expression:

$$d = 0.61h + 0.33. \quad (2)$$

Eq. (2), when combined with Eq. (1), yields the relation between (a), (w), and (h), which is:

$$w = a - 0.68h - 0.37. \quad (3)$$

These expressions have been found to hold for multilayer InP/InGaAsP structures (such as a DH) as well as for InP substrate material provided that the same etching conditions (0° C. with agitation) are used and essentially no mask undercutting occurs. Assuming an accuracy of ±0.15 μm in the measurement of the parameters (h) and (a), or (111) plane. The dislocation density was determined from etch pitting studies to be about $8 \times 10^4$ $cm^{-2}$. The mesa-etching apparatus was a 100 ml beaker containing approximately 80 ml of 1% (by volume) Br-methanol solution and a perforated Teflon TM basket for holding the wafer (Teflon is a trademark of Dow Corning Corporation). Although both plasma deposited SiO$_2$ and Si$_3$N$_4$ etching masks were tried, we found that SiO$_2$ masks deposited under the following conditions were preferred from an undercutting standpoint.

A commercially available plasma deposition system (Plasma Therm PK-12) was used. The measured plasma RF power density was about 40–50 mW/cm$^2$, the chamber pressure was about 500–1000 mTorr, and the substrate table temperature was about 200°–300° C. When gas concentrations of 3% silane in argon (324 sccm) and 100% nitrous oxide (420 sccm) were mixed in the chamber, the deposition rate was 670 Å/min. The resultant SiO$_2$ films had a refractive index of 1.47±0.015, an etch rate in BOE (6:1, NH$_4$F:HF) of 3200 Å/min., and low compressive stress of about 1×10$^9$ dynes/cm. These SiO$_2$ films were also found to produce less undercutting than SiO$_2$ films deposited using other techniques such as sputtering.

Using this plasma deposition procedure, 3000 Å of SiO$_2$ was deposited on the (001) surface of the wafer. Stripes and windows were then defined along each orientation ([110] and [111]) using standard photolithographic techniques. These samples were then etched to a depth of 4.0–5.0 μm using a 1% (by volume) Br-methanol solution at an essentially constant temperature of about 0° C. The resultant mesa and channel profiles were observed from the appropriate cleavage plane. Because crystallographic planes near the {111}A planes tend to etch the slowest, these planes tend to develop as etching proceeds. For this reason the planar crystallographic features found are thought to be closely related to {111}A planes, although the measured the calculated accuracy in the determination of the parameters (d) and (w) from Eqs. (2) and (3) is ±0.10 μm and ±0.18 μm, respectively.

In the development of Br-methanol etching for channel and mesa formation, we have paid considerable attention to the problem of mask undercutting. In the fabrication of BH lasers, mask undercutting can result in the loss of precise dimensional control over the mesa, leading to a poor yield of single transverse mode devices. In addition, mask undercutting is frequently non-uniform (along a BH stripe, for example), and large scattering effects may result from the widely varying lateral dimension of the active region. Finally, excessive mask undercutting may seriously influence the manner in which epitaxial layer growth takes place near a mesa or channel in a subsequent regrowth step and is, therefore, again undesirable.

Two parameters which influence mask undercutting during the etching process are temperature and sample/solution agitation. SEM micrographs were taken of mesas etched to the same depth using a 1% Br-methanol solution at 0° C. (with agitation), and 25° C. (with minimal agitation), respectively. The etching mask used for these samples was plasma deposited SiO$_2$ as described above. Qualitatively, we found that in the case of the mesa etched at 25° C. with minimal agitation the sidewalls tend to be significantly rounded, with a weak (111)A crystallographic feature and a total-etch-depth:undercut ratio of about 2:1. In contrast, the mesa etched at 0° C. with agitation was characterized by a strong (111)A crystallographic feature and a total-etch-depth:undercut ratio in excess of 20:1.

A third factor which has been found to influence undercutting is mask composition. As mentioned previously, we found that plasma deposited Si$_3$N$_4$ etching masks tend to undercut more than plasma deposited SiO$_2$ masks under identical etching conditions. This difference may be related to a stress-induced enhancement of the etch rate near the mask, since we have found a weak correlation between the degree of undercutting and the Si$_3$N$_4$ deposition parameters. However, effects due to mask adhesion or surface-enhanced diffusion of the etchant cannot be ruled out.

An additional factor which has been found to influence mask undercutting during the fabrication of BH lasers is the composition of the top p$^+$-InGaAsp cap layer normally grown on the DH for contact purposes. We find that a p$^+$-InGaAsP layer having a bandgap of 0.97 eV (lattice-matched to InP) tends to undercut significantly, whereas a p$^+$-InGaAsP having a bandgap of about 1.20 eV essentially eliminates this problem. More specifically, for undercutting of less than about 0.5 μm on a side, the bandgap of the cap layer should be greater than about 1.05 eV, but for a specific contact resistance of less than about 10$^{-5}$ ohm-cm the bandgap should be less than about 1.24 eV.

EXAMPLE II

The following example describes the use of the procedures of EXAMPLE I to fabricate a BH laser of the type shown in FIG. 2.

On a (100)-oriented, Sn-doped, InP substrate (n~10$^{18}$ cm$^{-3}$) we used LPE to grow the following essentially lattice-matched, epitaxial layers in the order recited: a 6 μm thick Sn-doped n-InP (n~2×10$^{18}$ cm$^{-3}$) cladding layer 12, a 0.2 μm thick, unintentionally doped In$_x$Ga$_{1-x}$As$_y$P$_{1-y}$ (x=0.75, y=0.55, E$_g$=0.99 eV) active layer 14, a 2.6 μm thick Zn-doped InP (p~1×10$^{18}$ cm$^{-3}$) cladding layer 16, and a 0.7 μm thick Zn-doped InGaAsP (p~4×10$^{18}$ cm$^{-3}$, E$_g$=1.20) cap layer 18.

To form mesas from this heterostructure, a 0.3 μm thick SiO$_2$ layer was plasma deposited on cap layer 18 and was patterned using standard photolithography to define stripe masks 20 which extended along the [110] direction. A solution of 1% Br in methanol was used to form the mesa of FIG. 1 with h=5.3 μm and a=5.6 μm, from which we used Eqs. (1)–(3) to calculate that w=1.63 μm and d=3.56 μm. Undercutting of mask 20 was measured to be less than 0.2 μm on a side.

Next, LPE was again used to regrow a 1.0 μm thick, Zn-doped (p~8×10$^{17}$ cm$^{-3}$) InP blocking layer 22 and a 4.5 μm thick Sn-doped (n~2×10$^{17}$ cm$^{-3}$) InP blocking layer 24, both along the sides of the mesa so that the top of layer 24 was essentially co-planar with the top of the mesa.

Standard evaporation was used to deposit a Au/Sn/Au broad area contact 28 on substrate 10 and to deposit a Au/Zn stripe geometry contact 30 on the cap layer 18. Contact 30 was delineated by an opening in dielectric (e.g., SiO$_2$) layer 32.

After metallization was complete, the wafer was diced into laser chips using standard sawing and cleaving. In operation, these lasers exhibited a median room temperature c.w. threshold current of 28 mA. Oscillation occurred both in the fundamental transverse mode and in a single longitudinal mode at λ=1.32 μm.

EXAMPLE III

This example describes experiments which demonstrate the efficacy of using a narrow bandgap InGaAsP cap layer to facilitate contacting with an InP protective layer to limit undercutting.

Once again (100)-oriented, Sn-doped n~$10^{18}$ cm$^{-3}$ InP substrates were employed. A 0.7 μm thick, Zn-doped (p~$1\times10^{19}$ cm$^{-3}$) InGaAsP ($\lambda=1.55$ μm) layer was LPE-grown on the substrate, and a 0.25 μm thick, Zn-doped (p~$2.5\times10^{18}$ cm$^{-3}$) InP layer was grown on the InGaAsP layer. As described in EXAMPLE I, plasma deposited SiO$_2$ mask stripes were formed along the [110] direction and the mesas were etched to a depth of 6.2 μm using Br-methanol. The InP layer limited undercutting of the mask to less than 0.1 μm on a side.

Thus, this procedure followed by the regrowth and selective etching steps described with reference to FIGS. 3-5 can be used to fabricate a BH laser of the type shown in FIG. 5.

It is to be understood that the above-described arrangements are merely illustrative of the many possible specification embodiments which can be devised to represent application of the principles of the invention. Numerous and varied other arrangements can be devised in accordance with these principles by those skilled in the art without departing from the spirit and scope of the invention. In particular, while the various aspects of our invention have been described in terms of light emitting diodes operating as lasers, it will be apparent that the invention is also applicable to light emitting diodes operating as sources of spontaneous emission (e.g., edge-emitting LEDs).

What is claimed is:

1. A buried heterostructure device comprising:
   an elongated, mesa-shaped, double heterostructure which includes a pair of opposite-conductivity-type InP cladding layers and an InGaAsP active layer disposed between said cladding layers and essentially lattice-matched thereto,
   a p$^+$-InGaAsP contact-facilitating layer formed on said heterostructure and essentially lattice-matched thereto, and
   a pair of opposite-conductivity-type InP blocking layers on each side of said mesa so as to form therebetween a p-n junction which is reverse-biased when said cladding layers are forward-biased, characterized in that
   said contact-facilitating layer has a bandgap in the range of approximately 1.05-1.24 eV.

2. The device of claim 1 for use as a laser and further including electrode means for forward-biasing said cladding layers and applying current to said active layer in excess of the lasing threshold, thereby to generate optical radiation therefrom, and resonator means for causing stimulated emission of said radiation.

3. A buried heterostructure semiconductor device comprising:
   an elongated, mesa-shaped, double heterostructure which includes a pair of opposite-conductivity-type InP cladding layers and an InGaAsP active layer disposed therebetween and essentially lattice-matched thereto,
   a p$^+$-type contact-facilitating layer on said heterostructure and essentially lattice-matched thereto, and contact-facilitating layer comprising a compound which includes In, Ga and As and has a bandgap less than about 1.05 eV,
   a pair of opposite-conductivity-type InP blocking layers epitaxially grown along each side of said mesa so as to form therebetween a p-n junction which is reverse-biased when said cladding layers are forward-biased, and
   an InGaAsP layer formed on top of each of said pairs and adjacent said contact-facilitating layer.

4. The device of claim 3 wherein said contact-facilitating layer comprises a ternary compound of InGaAs.

5. The device of claim 3 wherein said contact-facilitating layer comprises a quaternary compound in InGaAsP.

6. The device of claim 3 for use as a laser and further including electrode means for forward-biasing said cladding layers and applying current to said active layer in excess of the lasing threshold, thereby to generate optical radiation therefrom, and resonator means for causing stimulated emission of said radiation.

7. The device of claim 3 including a single crystal n-InP substrate on which said heterostructure is formed and wherein said electrode means comprises at least one metal layer making ohmic contact to said contact-facilitating layer and at least one other metal layer making ohmic contact to said substrate.

* * * * *